(12) United States Patent
Kamoda et al.

(10) Patent No.: US 11,791,234 B2
(45) Date of Patent: Oct. 17, 2023

(54) SEMICONDUCTOR DEVICE HAVING CONTROLLER WITH GRAPHITE SHEET

(71) Applicant: KIOXIA CORPORATION, Tokyo (JP)

(72) Inventors: Ryo Kamoda, Yokohama Kanagawa (JP); Hideki Takahashi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 85 days.

(21) Appl. No.: 17/191,309

(22) Filed: Mar. 3, 2021

(65) Prior Publication Data

US 2022/0102239 A1 Mar. 31, 2022

(30) Foreign Application Priority Data

Sep. 30, 2020 (JP) .................. 2020-164568

(51) Int. Cl.
*H01L 23/373* (2006.01)
*H01L 23/00* (2006.01)
(Continued)

(52) U.S. Cl.
CPC ........ *H01L 23/3735* (2013.01); *H01L 21/563* (2013.01); *H01L 23/367* (2013.01);
(Continued)

(58) Field of Classification Search
CPC ..... H01L 24/85; H01L 23/373; H01L 23/367; H01L 23/3735; H01L 25/18; H01L 23/3135; H01L 24/45; H01L 23/4334; H01L 23/552; H01L 21/563; H01L 24/16; H01L 2924/1438; H01L 2224/45147; H01L 23/3128; H01L 2224/73265; H01L 2224/45144; H01L 2224/85355; H01L 34/5383; H01L 2224/48227; H01L 2225/0651; H01L 24/32; H01L 2224/45139; H01L 25/50;
(Continued)

(56) References Cited

U.S. PATENT DOCUMENTS

2015/0179617 A1* 6/2015 Lin .................. H01L 23/42
257/713
2015/0380061 A1* 12/2015 Matsumoto ............ H05K 1/113
365/51

(Continued)

FOREIGN PATENT DOCUMENTS

CN 102867793 A 1/2013
JP 5967206 B2 8/2016
(Continued)

*Primary Examiner* — Alexander O Williams
(74) *Attorney, Agent, or Firm* — Kim & Stewart LLP

(57) ABSTRACT

A semiconductor device includes a substrate that has a first surface and a second surface on which a plurality of solder balls are provided, a semiconductor memory on the first surface of the substrate, a controller arranged on the first surface of the substrate, separated from the semiconductor memory along a first direction, and configured to control the semiconductor memory, a graphite sheet extending along the first direction above the controller and the semiconductor memory, and a first sealing material that seals the semiconductor memory, the controller, and the graphite sheet.

20 Claims, 14 Drawing Sheets

(51) Int. Cl.
*H01L 25/18* (2023.01)
*H01L 23/552* (2006.01)
*H01L 23/367* (2006.01)
*H01L 21/56* (2006.01)

(52) U.S. Cl.
CPC ............ *H01L 23/552* (2013.01); *H01L 24/45* (2013.01); *H01L 24/85* (2013.01); *H01L 25/18* (2013.01); *H01L 2224/4556* (2013.01); *H01L 2224/85355* (2013.01); *H01L 2224/85375* (2013.01); *H01L 2924/1431* (2013.01); *H01L 2924/1438* (2013.01)

(58) Field of Classification Search
CPC ........... H01L 2924/19107; H01L 24/48; H01L 2924/1431; H01L 23/49816; H01L 2224/32145; H01L 2924/15311; H01L 24/73; H01L 2224/8592; H01L 2225/06589; H01L 2924/3025; H01L 2224/32225; H01L 2224/85375; H01L 2225/06506; H01L 2924/00011; H01L 2225/06537; H01L 2224/16227; H01L 2224/48145; H01L 2225/06562; H01L 2924/00012; H01L 2924/00014; H01L 2924/01049; H01L 2924/00
USPC ......................................................... 257/713
See application file for complete search history.

(56) References Cited

U.S. PATENT DOCUMENTS

| | | | |
|---|---|---|---|
| 2016/0293513 | A1 | 10/2016 | Hiruta |
| 2017/0023970 | A1* | 1/2017 | Kimura ................. G06F 3/0679 |
| 2018/0024600 | A1 | 1/2018 | Horiuchi |
| 2019/0198489 | A1* | 6/2019 | Kim ...................... H01L 23/481 |
| 2020/0027818 | A1 | 1/2020 | Kim et al. |
| 2020/0058571 | A1 | 2/2020 | Wang et al. |
| 2021/0098381 | A1* | 4/2021 | Yu ....................... H01L 21/4857 |

FOREIGN PATENT DOCUMENTS

| | | | | |
|---|---|---|---|---|
| KR | 20140057979 | A * | 5/2014 | .......... H01L 25/105 |
| KR | 20140057982 | A * | 5/2014 | .......... H01L 25/105 |
| KR | 20200047245 | A * | 5/2020 | ......... H01L 25/0657 |
| TW | 202010071 | A | 3/2020 | |

* cited by examiner

SEMICONDUCTOR DEVICE HAVING CONTROLLER WITH GRAPHITE SHEET

CROSS-REFERENCE TO RELATED APPLICATION

This application is based upon and claims the benefit of priority from Japanese Patent Application No. 2020-164568, filed Sep. 30, 2020, the entire contents of which are incorporated herein by reference.

FIELD

Embodiments described herein relate generally to a semiconductor device and a manufacturing method thereof.

BACKGROUND

In recent years, a common semiconductor device is used in a form of a resin-molded package. In particular, a ball grid array (BGA) type solid-state drive (SSD) having an improved performance is widely used. It is known that such a BGA type SSD tends to undesirably radiate electromagnetic waves and generate heat.

DETAILED DESCRIPTION

Figure 1:
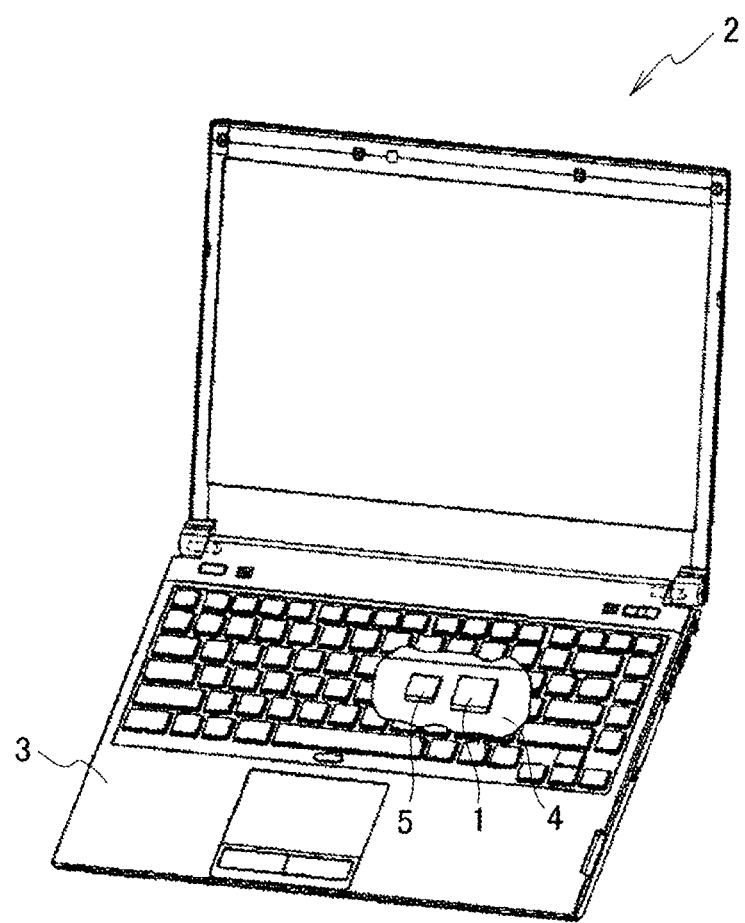
FIG. 1 is a schematic diagram illustrating an electronic apparatus including a semiconductor device according to a first embodiment.

Embodiments provide a semiconductor device capable of shielding electromagnetic waves and improving heat dissipation.

In general, according to one embodiment, a semiconductor device includes a substrate that has a first surface and a second surface on which a plurality of solder balls are provided, a semiconductor memory on the first surface of the substrate, a controller arranged on the first surface of the substrate, separated from the semiconductor memory along a first direction, and configured to control the semiconductor memory, a graphite sheet extending along the first direction above the controller and the semiconductor memory, and a first sealing material that seals the semiconductor memory, the controller, and the graphite sheet.

Next, certain example embodiments will be described with reference to the drawings. In the following description, the same or similar components are denoted by the same or similar reference numerals. The drawings are schematic drawings. Further, the following embodiments exemplify apparatuses and methods for embodying technical ideas, and do not limit materials, shapes, structures, arrangements, or the like of the components. Various modifications may be made in these embodiments.

First Embodiment

FIG. 1 is a schematic configuration diagram illustrating an electronic apparatus 2 including a semiconductor device 1 according to a first embodiment. The electronic apparatus 2 includes a housing 3. The housing 3 accommodates a circuit board or main board 4. The circuit board 4 includes the semiconductor device 1 and a host controller 5 (for example, a CPU (Central Processing Unit)). The semiconductor device 1 is, for example, a BGA SSD. The semiconductor device 1 functions as a storage device for the electronic apparatus 2. The host controller 5 controls overall operations of the electronic apparatus 2 including the semiconductor device 1. The host controller 5 includes, for example, a south bridge.

Figure 2:
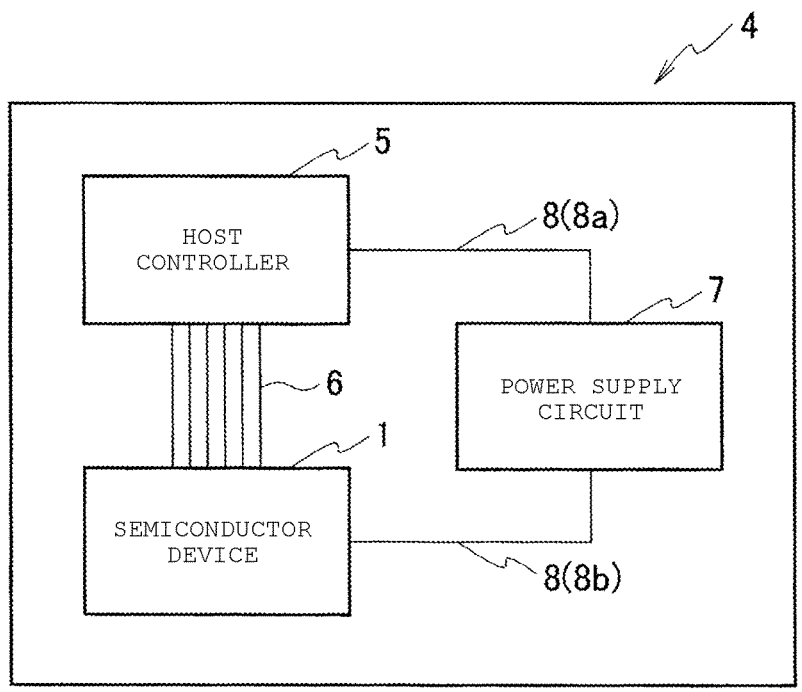
FIG. 2 is a block diagram schematically illustrating a circuit board according to a first embodiment.

FIG. 2 is a block diagram schematically illustrating the circuit board 4. A power supply circuit 7 is provided on the circuit board 4. The power supply circuit 7 is connected to the semiconductor device 1 and the host controller 5 via power supply lines 8 (8a, 8b). The power supply circuit 7 applies a power supply voltage to the host controller 5 via the power supply line 8 (8a). Further, the power supply circuit 7 applies the power supply voltage to the semiconductor device 1 via the power supply line 8 (8b).

A plurality of signal lines 6 are provided between the semiconductor device 1 and the host controller 5. The semiconductor device 1 transmits and receives signals to and from the host controller 5 via the signal lines 6. The semiconductor device 1 and the host controller 5 include, for example, an interface circuit conforming to a PCI-express (hereinafter, PCIe) standard. The interface circuit provided in the semiconductor device 1 and the host controller 5 does not necessarily have to be an interface circuit conforming to the PCIe standard. The interface circuit provided in the host controller 5 and the semiconductor device 1 may conform to, for example, a serial attached SCSI (SAS) standard or a serial advanced technology attachment (SATA) standard. Further, the interface circuit provided in the host controller 5 and the semiconductor device 1 may conform to another standard such as nonvolatile memory express (NVMe) and Universal Serial Bus (USB).

Configuration of Semiconductor Device

Next, a configuration of the semiconductor device 1 will be described.

Figure 3:
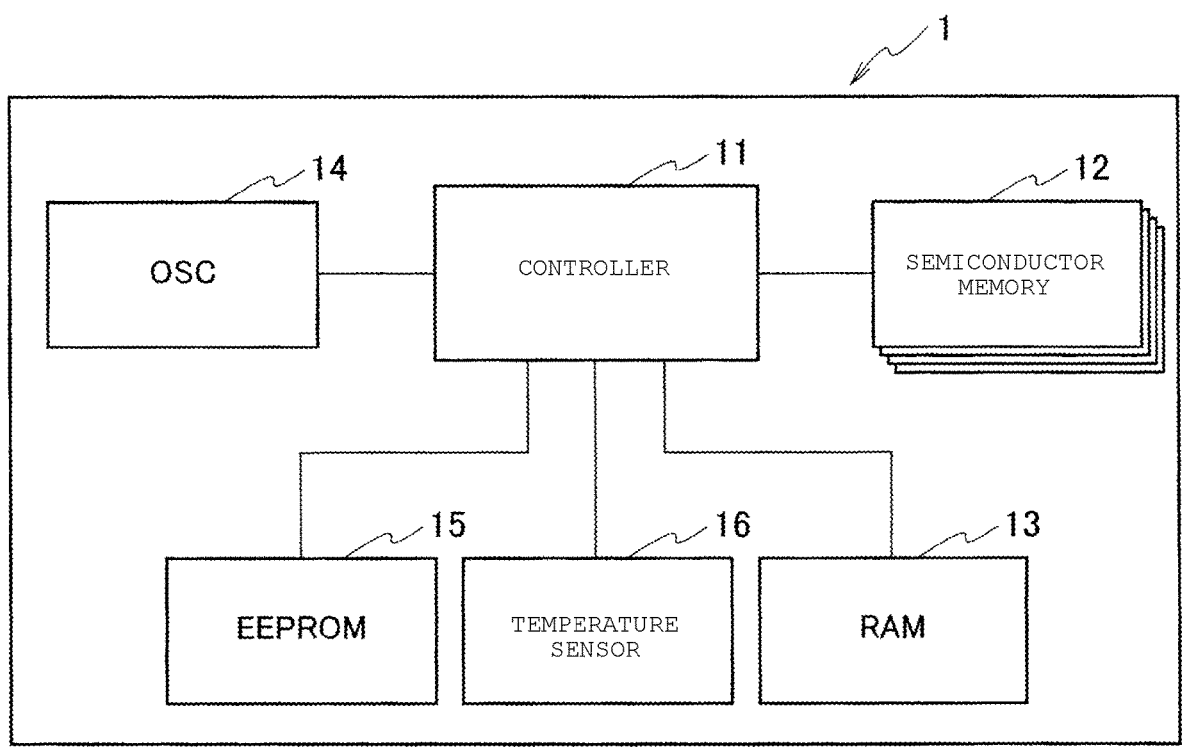
FIG. 3 is a block diagram illustrating a semiconductor device according to a first embodiment.
Figure 4:
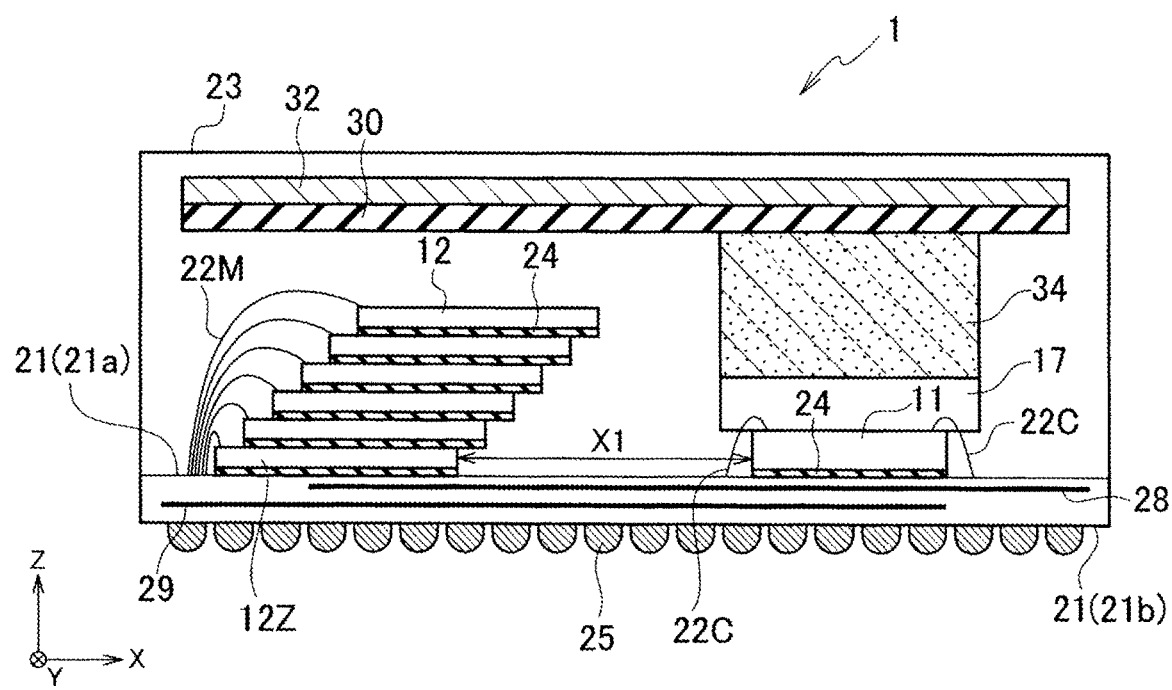
FIG. 4 is a sectional view of a semiconductor device according to a first embodiment.
Figure 5:
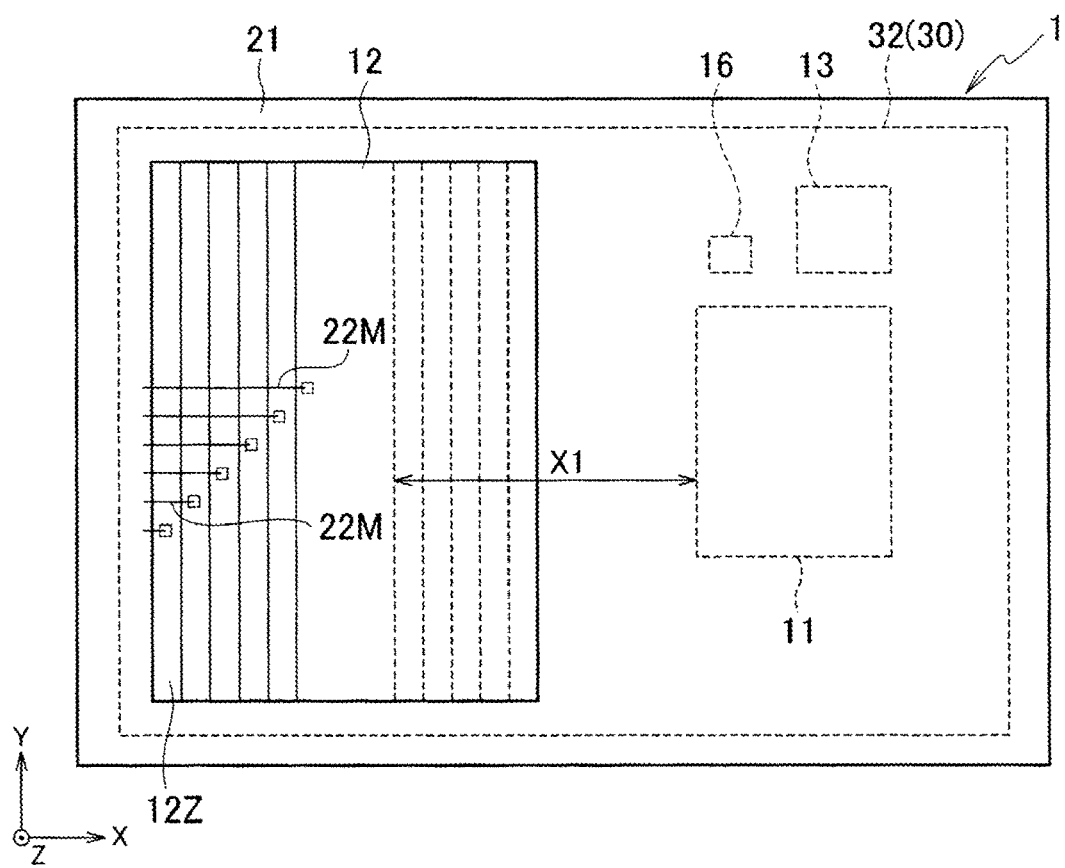
FIG. 5 is a top view of a semiconductor device according to a first embodiment.

FIG. 3 is a block diagram illustrating the semiconductor device 1. FIG. 4 is a sectional view of the semiconductor device 1 according to a first embodiment. FIG. 5 is a top view of the semiconductor device 1. The semiconductor device 1 includes a controller 11, a semiconductor memory 12, a random access memory (RAM) 13, an oscillator (OSC) 14, an electrically erasable and programmable rom (EEPROM) 15, a temperature sensor 16, a package board or a substrate 21 (hereinafter simply referred to as the board 21), bonding wires 22M and 22C, an insulating film 17, a first heat conductive plate 34, an insulating sheet 30, a graphite sheet 32, a sealing portion or a molding material 23, a mount film 24, and a solder ball 25.

The controller 11 is an integrated circuit that controls an operation of the semiconductor memory 12. In the controller 11, a processor core, a microcontroller, and the like are integrated on one integrated circuit chip. The processor core, the microcontroller, and the like function as a SoC (system on a chip) in cooperation with each other.

The semiconductor memory 12 is, for example, a NAND flash memory. The semiconductor memory 12 may be, for example, a NOR-type flash memory, a resistive random access memory (ReRAM), a phase-change memory (PCM), and a ferroelectric random access memory (FeRAM), and a magneto tunnel junction (MTJ) variable resistance element.

The RAM 13 is a volatile memory. The RAM 13 is, for example, a DRAM. The RAM 13 stores management information of the semiconductor memory 12. The RAM 13 is used, for example, for caching data.

The oscillator (OSC) 14 supplies an operation signal having a predetermined frequency to the controller 11.

The EEPROM 15 is a nonvolatile memory. The EEPROM 15 stores a control program(s) and the like.

The temperature sensor 16 measures a temperature inside the semiconductor device 1. The temperature sensor 16 transmits, to the controller 11, the measured temperature as temperature information.

The board 21 is a multi-layer wiring board. The board 21 includes a first surface 21a and a second surface 21b located on an opposite side of the first surface 21a. The board 21 includes a power supply layer 28 and a ground layer 29.

The bonding wires 22M and 22C are, for example, copper wires, silver wires, or gold wires. The diameters of the bonding wires 22M and 22C are, for example, approximately 20 μm to 50 μm.

The insulating film 17 is a flexible insulating film. A film on wire (FOW) technique is applied to the insulating film 17. Thus, a part of the bonding wire 22C may be incorporated in the insulating film 17. A thickness of the insulating film 17 is, for example, approximately 50 μm. The insulating film 17 has a thickness such that a part of the bonding wire 22C is embedded therein.

The first heat conductive plate 34 is, for example, a silicon substrate. The first heat conductive plate 34 may be a substrate having a high heat conductivity other than the silicon substrate. The first heat conductive plate 34 is disposed on the controller 11 via the insulating film 17. Further, the first heat conductive plate 34 is disposed between the insulating film 17 and the insulating sheet 30. The first heat conductive plate 34 can efficiently transfer heat generated from the controller 11 to the graphite sheet 32.

The insulating sheet 30 is, for example, an alumina sheet. The insulating sheet 30 protects the graphite sheet 32. The insulating sheet 30 prevents the graphite sheet 32 from being electrically charged.

The graphite sheet 32 is used as a heat spreader. Heat of the semiconductor memory 12 is transferred to the graphite sheet 32 via the sealing portion 23. Further, the heat of the controller 11 is transferred to the graphite sheet 32 via the first heat conductive plate 34. The graphite sheet 32 has an anisotropic heat conductivity. The graphite sheet 32 has, for example, high heat conductivity in a direction parallel to the board 21. Further, the graphite sheet 32 may have a high heat conductivity in a direction parallel to the board 21 and a direction orthogonal to the board 21. The graphite sheet 32 is, for example, in an electrically floating state. Further, the graphite sheet 32 may be connected to a ground potential. The graphite sheet 32 is disposed on the first heat conductive plate 34. The graphite sheet 32 covers the first heat conductive plate 34 and the controller 11 in a plan view. Further, the graphite sheet 32 covers the semiconductor memory 12 via the sealing portion 23 in a plan view. The graphite sheet 32 is smaller than the sealing portion 23. The graphite sheet 32 is smaller than the board 21. The graphite sheet 32 and the insulating sheet 30 have substantially the same size.

The sealing portion 23 is formed of, for example, a molding material such as an epoxy resin. The sealing portion 23 is provided on the first surface 21a of the board 21. The sealing portion 23 seals the semiconductor memory 12, the controller 11, the first heat conductive plate 34, the insulating film 17, the graphite sheet 32, the insulating sheet 30, the bonding wire 22M, and the bonding wire 22C.

The mount film 24 is an adhesive film. The mount film 24 is used for fixing the semiconductor memory 12 and the controller 11 to the board 21.

The solder ball 25 is used to connect the semiconductor device 1 to another external device or circuit. The solder ball 25 has, for example, a spherical shape. The solder balls 25 are provided on the second surface 21b of the board 21.

Structure of Semiconductor Device

Next, a structure of the semiconductor device 1 will be described.

As illustrated in FIG. 4, the semiconductor memory 12 is provided on the first surface 21a of the board 21. The semiconductor memory 12 is fixed to the first surface 21a by the mount film 24. A plurality of semiconductor memories 12 are electrically connected to the controller 11 via the board 21. Further, on the first surface 21a, the semiconductor memory 12 and the controller 11 are arranged side by side is an X direction perpendicular to a Y direction. Here, a Z direction is orthogonal to the first surface 21a.

The plurality of semiconductor memories 12 may be stacked. The plurality of semiconductor memories 12 are shifted along the X direction and are stacked along the Z-direction. Further, the plurality of semiconductor memories 12 are fixed by the mount film 24. Further, the plurality of semiconductor memories 12 are electrically connected to the board 21 by the bonding wires 22M. When the FOW technique is applied to the mount film 24, the bonding wires 22M may be incorporated in the mount film 24. In the following, among the plurality of semiconductor memories 12, the lowest-layer semiconductor memory is particularly referred to as the semiconductor memory 12Z. The semiconductor memory 12Z is disposed on the first surface 21a of the board 21 at a distance X1 from the controller 11. A value of the distance X1 is, for example, several mm.

Figure 6:
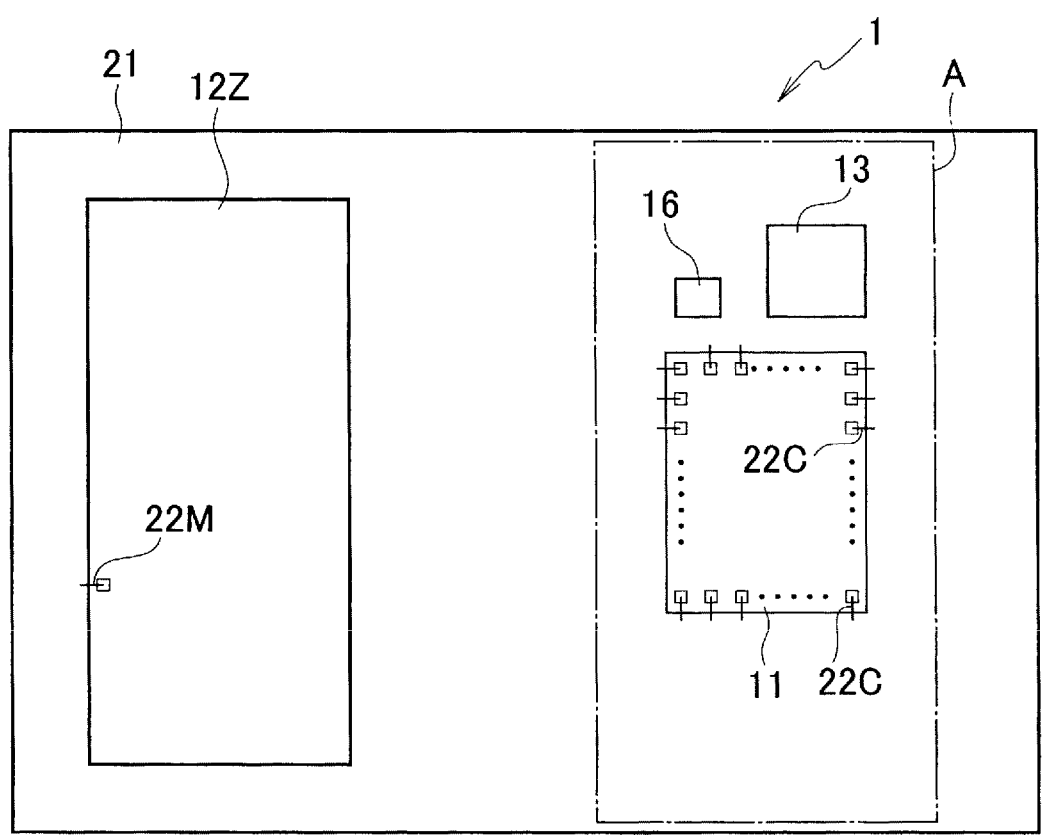
FIG. 6 is a diagram illustrating a semiconductor device according to a first embodiment.

FIG. 6 is a diagram illustrating the semiconductor device 1. In an embodiment, the controller 11, the RAM 13, and the temperature sensor 16 are provided in a region A adjacent to the semiconductor memory 12.

The controller 11 is provided on the first surface 21a of the board 21. The controller 11 is fixed to the first surface 21a of the board 21 by, for example, the mount film 24. Further, the controller 11 is electrically connected to the board 21 by the bonding wires 22C.

The RAM 13 is provided on the first surface 21a of the board 21. The RAM 13 is fixed to the first surface 21a by the mount film 24 (not illustrated). The RAM 13 is electrically connected to the board 21 via the bonding wire. The RAM 13 is electrically connected to the controller 11 via the board 21.

The temperature sensor 16 is provided on the first surface 21a of the board 21. The temperature sensor 16 is located, for example, in the vicinity of the controller 11. More specifically, a distance from the temperature sensor 16 to the controller 11 is shortest among distances from the temperature sensor 16 to the semiconductor memory 12Z, the controller 11, and the RAM 13.

Graphite Sheet

Figure 7:
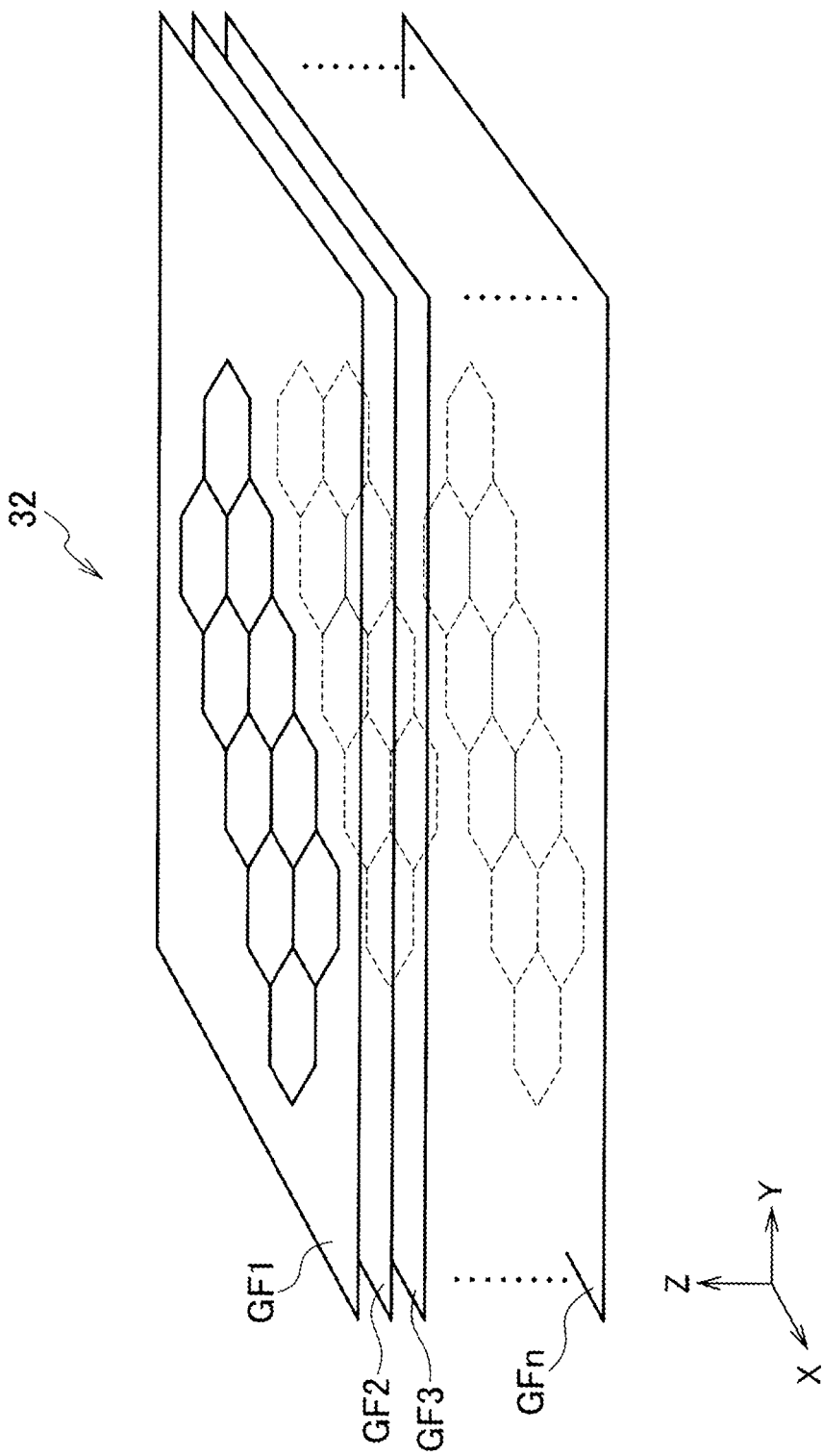
FIG. 7 is a diagram of a graphite sheet that is applicable to a semiconductor device according to a first embodiment.

FIG. 7 is a diagram of an example of the graphite sheet 32. The graphite sheet 32 includes multiple graphene films GF1, GF2, GF3, . . . , GFn. In the graphite sheet 32, a stacked structure is formed by the graphene films GF1, GF2, GF3, . . . , GFn. In each of the graphene films GF1, GF2, GF3, . . . , GFn, one crystal structure includes a plurality of hexagonal-crystal-system covalent bonds. The adjacent graphene films GF1, GF2, GF3, . . . , GFn are bound to each other by van der Waals forces. Each of the graphene films GF1, GF2, GF3, . . . , GFn has a higher heat conductivity in a crystal plane direction (e.g., on an XY plane) than in a thickness direction corresponding to the Z axis.

As the graphite sheet 32, two types of graphite sheets including a first graphite sheet GF (XY) and a second graphite sheet GF (XZ) may be used. The two types of graphite sheets have different orientations.

Figure 8:
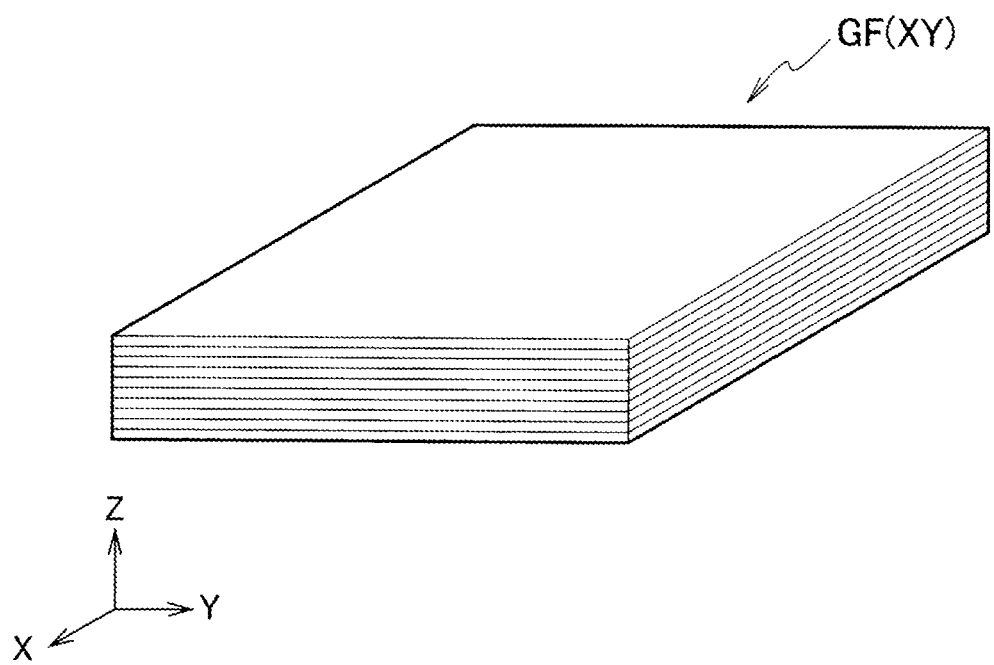
FIG. 8 is a diagram illustrating a graphite sheet that is applicable to a semiconductor device according to a first embodiment.

FIG. 8 is a diagram illustrating a first graphite sheet GF (XY). The first graphite sheet GF (XY) has an XY orientation. The first graphite sheet GF (XY) has a higher heat conductivity in the plane direction than the thickness direction. The first graphite sheet GF (XY) has, for example, a heat conductivity of approximately X=1500 (W/mK), a heat conductivity of approximately Y=1500 (W/mK), and a heat conductivity of approximately Z=5 (W/mK).

Figure 9:
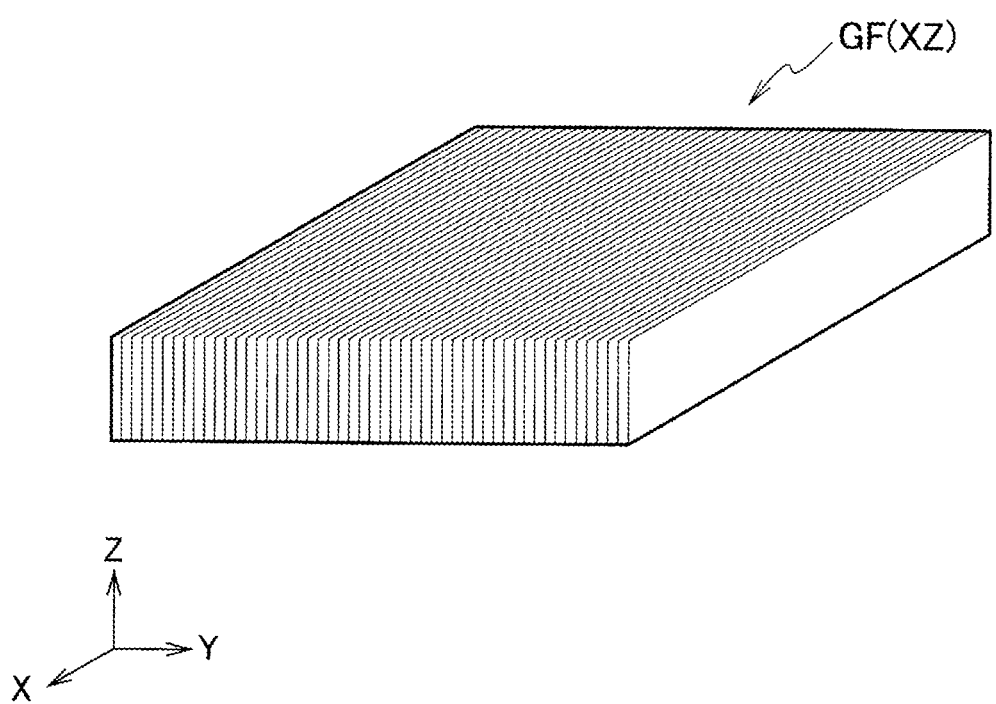
FIG. 9 is a diagram illustrating a graphite sheet that is applicable to a semiconductor device according to a first embodiment.

FIG. 9 is a diagram illustrating a second graphite sheet GF (XZ) according to the first embodiment. The second graphite sheet GF (XZ) has an XZ orientation. The second graphite sheet GF (XZ) has a higher heat conductivity in the thickness direction than the plane direction. The second graphite sheet GF (XZ) has, for example, a heat conductivity of approximately X=1500 (W/mK), a heat conductivity of approximately Y=5 (W/mK), and a heat conductivity of approximately Z=1500 (W/mK).

The semiconductor device 1 can efficiently release the heat of the controller 11 to the outside of the package. Thus, it is possible to reduce an increase in the temperature of the semiconductor memory 12. Further, the temperature sensor 16 is provided in the vicinity of the controller 11, and thus an accuracy of temperature detection of the semiconductor device 1 can be improved. Further, the semiconductor device 1 includes the graphite sheet 32 therein, and thus it is possible to electromagnetically shield the inside of the semiconductor device. Further, the semiconductor device 1 includes the graphite sheet 32 therein, and thus it is possible to improve heat dissipation. Modification Example 1

Figure 10:
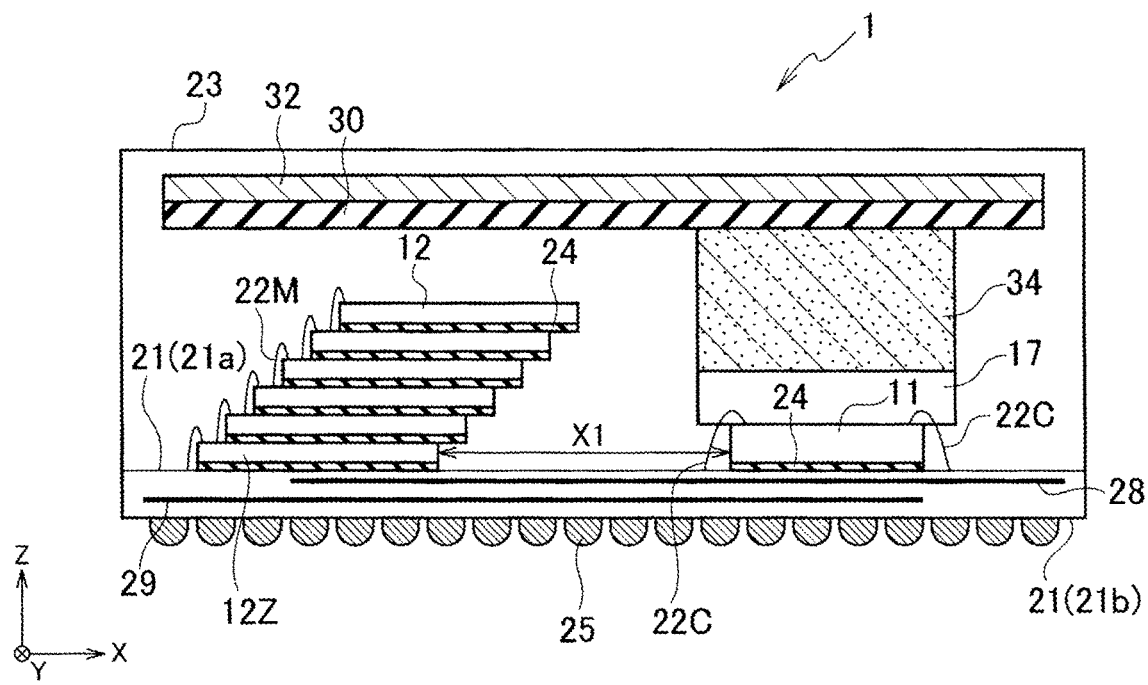
FIG. 10 is a sectional view of a semiconductor device according to a modification example.
Figure 11:
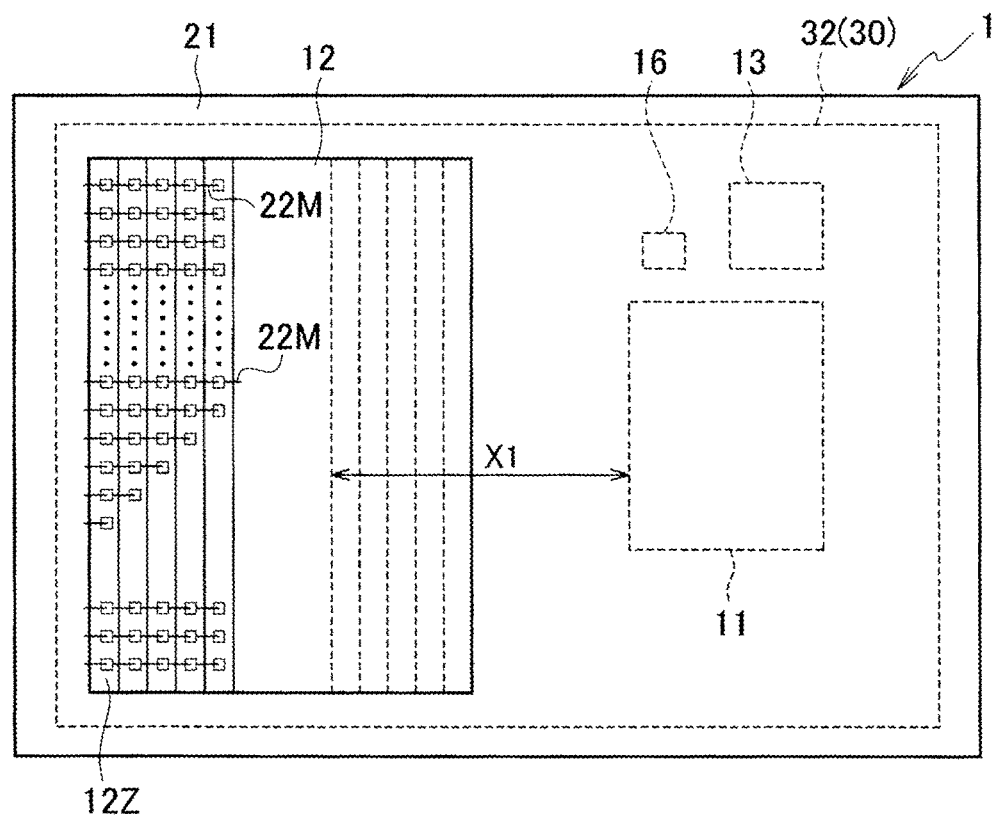
FIG. 11 is a top view of a semiconductor device according to a modification example.

FIG. 10 is a sectional view of the semiconductor device 1 according to a modification example. FIG. 11 is a top view of the semiconductor device 1. In FIGS. 10 and 11, the oscillator 14 and the EEPROM 15 provided in the semiconductor device 1 are not shown. Further, in FIG. 11, the sealing portion 23 is shown in the semiconductor device 1.

The semiconductor device 1 according to the modification example includes the board 21, the controller 11, the semiconductor memory 12, the bonding wires 22M and 22C, the first heat conductive plate 34, the insulating film 17, the graphite sheet 32, the insulating sheet 30, the sealing portion 23, the mount film 24, and the solder ball 25.

Figure 12:
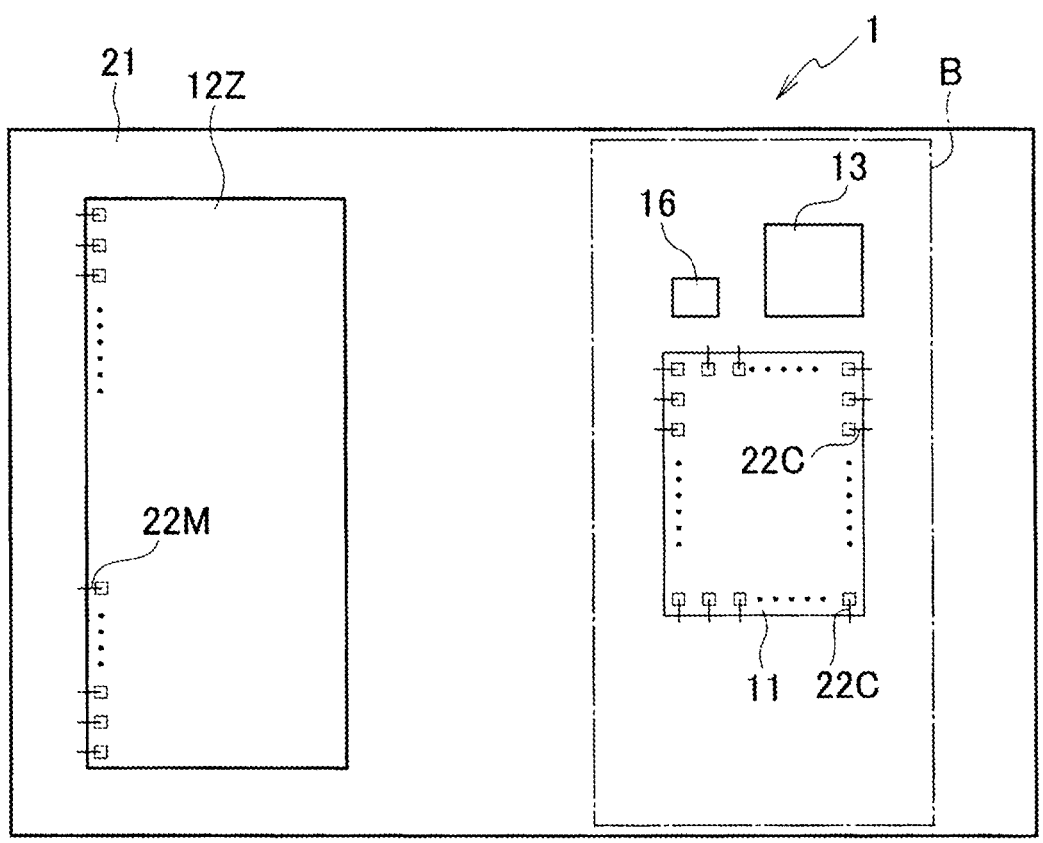
FIG. 12 is a diagram illustrating a semiconductor device according to a modification example.

FIG. 12 is a diagram illustrating the semiconductor device according to a modification example. In the modification example, the controller 11, the RAM 13, and the temperature sensor 16 are provided in a region B adjacent to the semiconductor memory 12. The plurality of bonding wires 22M electrically connect an end portion of the lowest-layer semiconductor memory 12Z and the board 21. The plurality of bonding wires 22C electrically connect a circumferential end portion of the controller 11 and the board 21.

The semiconductor device 1 can efficiently release the heat of the controller 11 to the outside of the package. Thus, it is possible to reduce an increase in the temperature of the semiconductor memory 12. Further, the semiconductor device 1 includes the graphite sheet 32 therein, and thus it is possible to electromagnetically shield the inside of the semiconductor device 1. Further, the semiconductor device 1 includes the graphite sheet 32 therein, and thus it is possible to improve heat dissipation.

Second Embodiment

Figure 13:
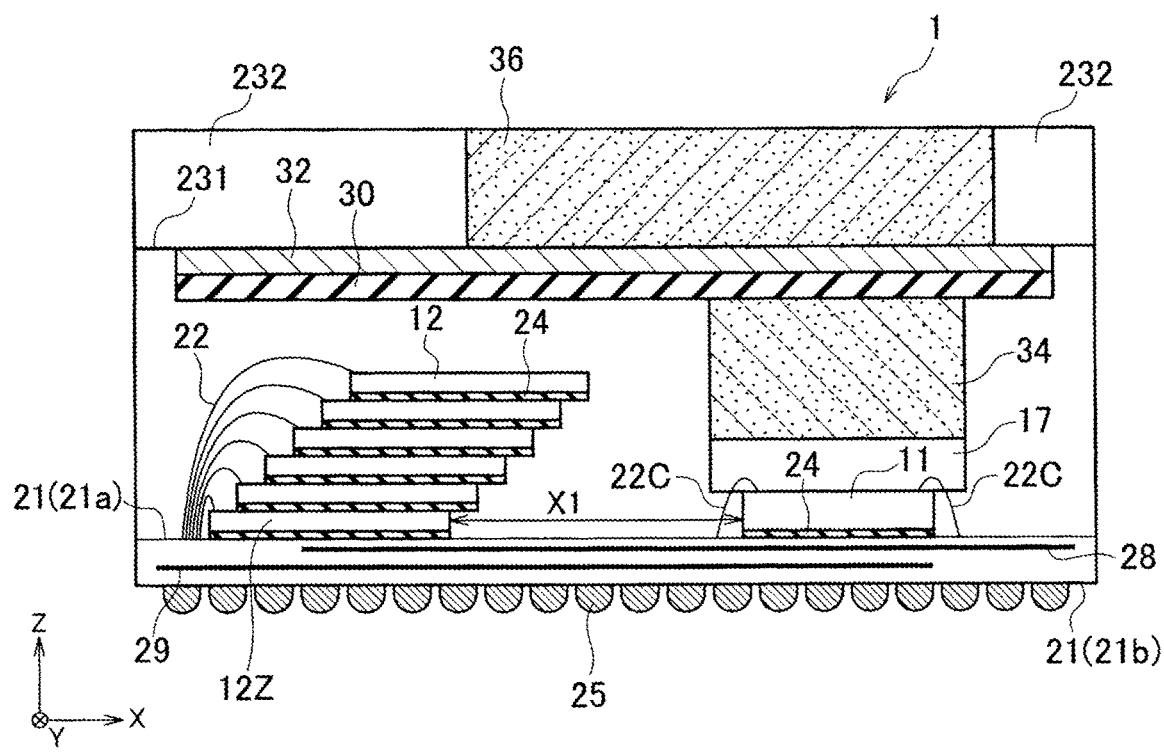
FIG. 13 is a sectional view of a semiconductor device according to a second embodiment.

FIG. 13 is a sectional view of the semiconductor device 1 according to a second embodiment. In FIG. 13, the oscillator 14, the EEPROM 15, the RAM 13, and the temperature sensor 16 provided in the semiconductor device 1 are not shown.

In the semiconductor device 1 according to the second embodiment, the bonding wires 22M electrically connect the semiconductor memory 12 and the board 21.

The semiconductor device 1 includes the board 21, the controller 11, the semiconductor memory 12, the bonding wires 22M and 22C, the first heat conductive plate 34, a second heat conductive plate 36, the insulating film 17, the graphite sheet 32, the insulating sheet 30, the sealing portions 231 and 232, the mount film 24, and the solder ball 25. The sealing portions 231 and 232 are for example molded resin materials or the like.

The second heat conductive plate 36 is a heat conductive plate for dissipating heat conducted to the graphite sheet 32 to the outside of the semiconductor device 1. The second heat conductive plate 36 is, for example, a silicon substrate. The second heat conductive plate 36 may be a substrate having a high heat conductivity other than the silicon substrate. The second heat conductive plate 36 is disposed on an upper surface of the graphite sheet 32.

The sealing portion 231 is formed of, for example, a molding material such as an epoxy resin. The sealing portion 231 seals the semiconductor memory 12, the controller 11, the first heat conductive plate 34, the insulating film 17, the graphite sheet 32, the insulating sheet 30, the bonding wire 22M, and the bonding wire 22C.

The sealing portion 232 is formed of, for example, a molding material such as an epoxy resin. The sealing portion 232 seals the graphite sheet 32 and the second heat conductive plate 36.

Figure 14:
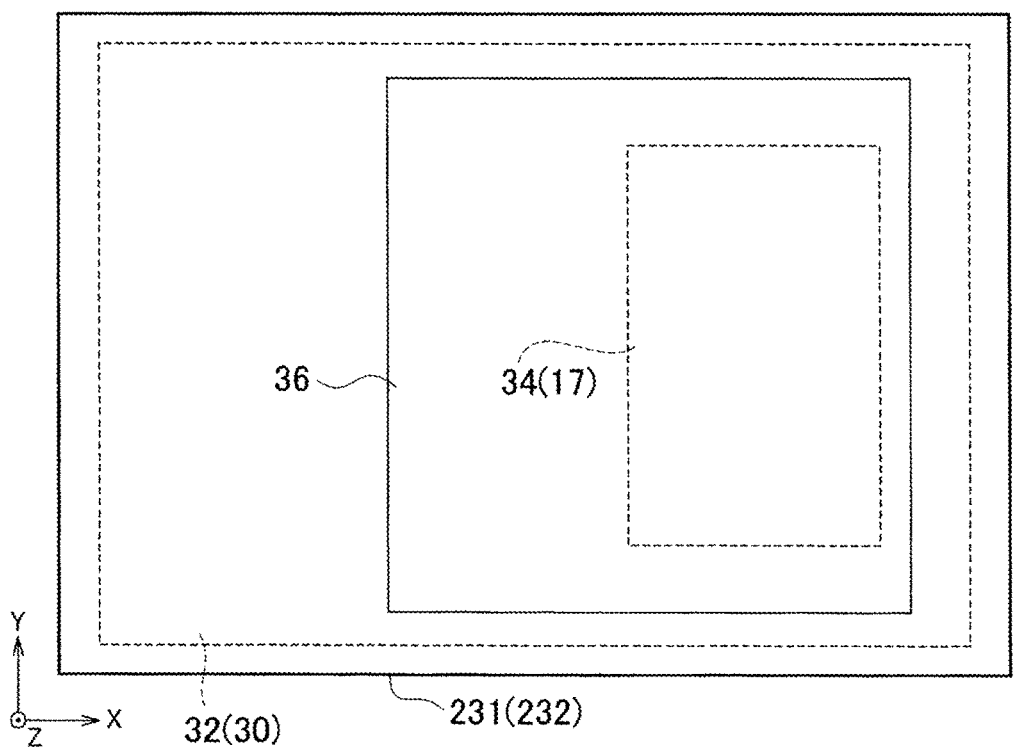
FIG. 14 is a top view of a semiconductor device according to a second embodiment.
Figure 15:
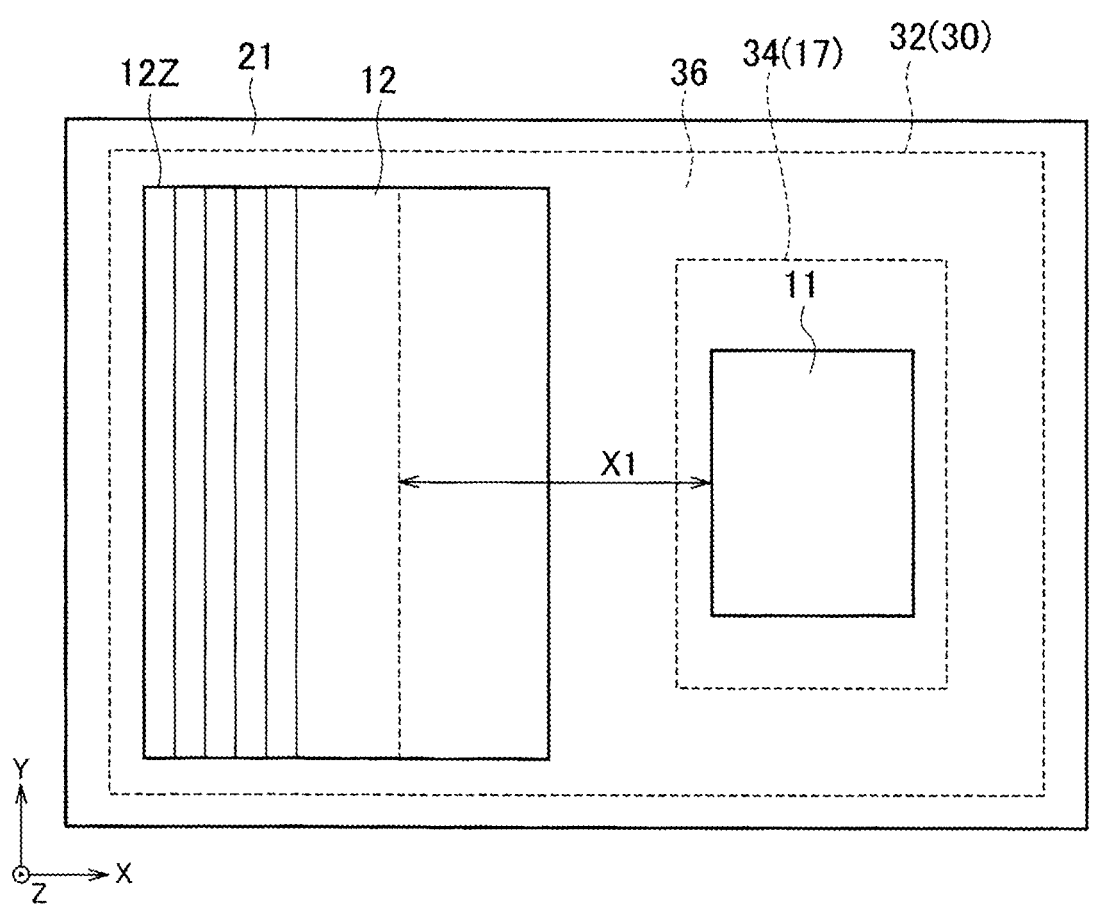
FIG. 15 is a top view illustrating a semiconductor device according to a second embodiment.

FIG. 14 is a top view of the semiconductor device 1. In FIG. 14, only the first heat conductive plate 34, the second heat conductive plate 36, the insulating film 17, the graphite sheet 32, the insulating sheet 30, and the sealing portions 231 and 232 are omitted from the depiction. FIG. 15 is a top view illustrating the semiconductor device 1. In FIG. 15, the sealing portions 231 and 232 are shown.

The first heat conductive plate 34 is disposed on the controller 11. The insulating film 17 is disposed on the controller 11. The first heat conductive plate 34 may also be disposed above the RAM and the temperature sensor.

The second heat conductive plate 36 is larger than the first heat conductive plate 34. An upper surface of the second heat conductive plate 36 is exposed to the outside of the sealing portion 232. Therefore, it is possible to efficiently dissipate heat to the outside of the semiconductor device 1 via the second heat conductive plate 36.

The semiconductor device 1 includes the graphite sheet therein, and the second heat conductive plate 36 is disposed on the graphite sheet 32. Thus, the heat of the semiconductor memory 12 and the controller 11 can be released to the second heat conductive plate 36 via the graphite sheet 32. Further, the semiconductor device 1 has a structure in which the graphite sheet 32 is interposed between the first heat conductive plate 34 and the second heat conductive plate 36. Thus, it is possible to improve heat dissipation speeds of the semiconductor memory 12 and the controller 11. Further, it is possible to efficiently release the heat of the controller to the outside of the package, and it is possible to reduce an increase in the temperature of the semiconductor memory. Further, the graphite sheet is provided in the semiconductor device, and thus it is possible to electromagnetically shield the inside of the semiconductor device. Further, the graphite sheet is provided in the semiconductor device, and thus it is possible to improve heat dissipation.

Manufacturing Method

Figure 16A:
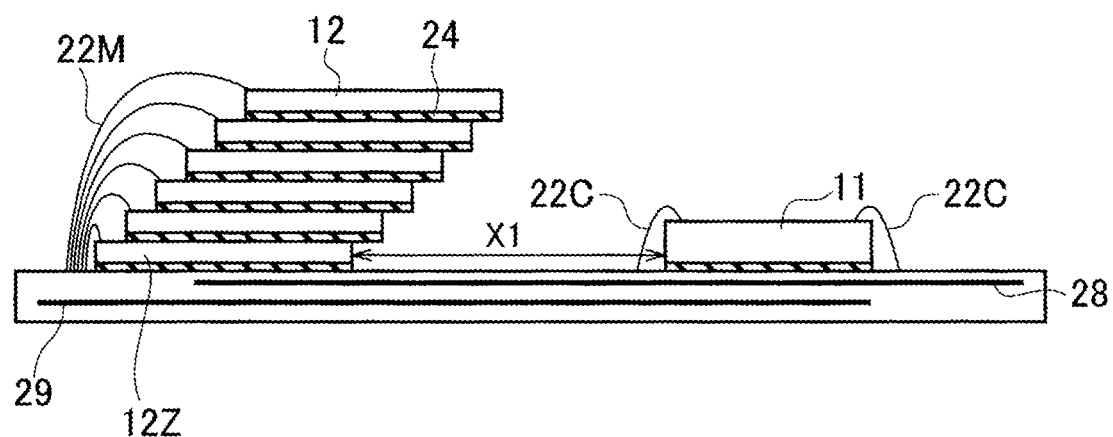
FIG. 16A is a first sectional view of a semiconductor device according to a second embodiment.

FIG. 16A is a first sectional view of the semiconductor device 1 according to a second embodiment.

(A1) First, as illustrated in FIG. 16A, the board 21, which has a first surface 21a and a second surface 21b located on an opposite side of the first surface 21a, is formed. The board 21 is a multi-layer wiring board, and includes a power supply layer 28 and a ground layer 29.

(A2) Next, as illustrated in FIG. 16A, a semiconductor memory 12 is disposed on the first surface 21a. The semiconductor memory 12 includes a plurality of layers. A controller 11 that can control the semiconductor memories 12 and 12Z is disposed so as to be separated from the lowest-layer semiconductor memory 12Z by a distance X1 in the X direction.

(A3) Next, as illustrated in FIG. 16A, bonding wires 22C are connected to an upper surface of the controller 11. Further, bonding wires 22M are connected to upper surfaces of the semiconductor memories 12 and 12Z.

Figure 16B:
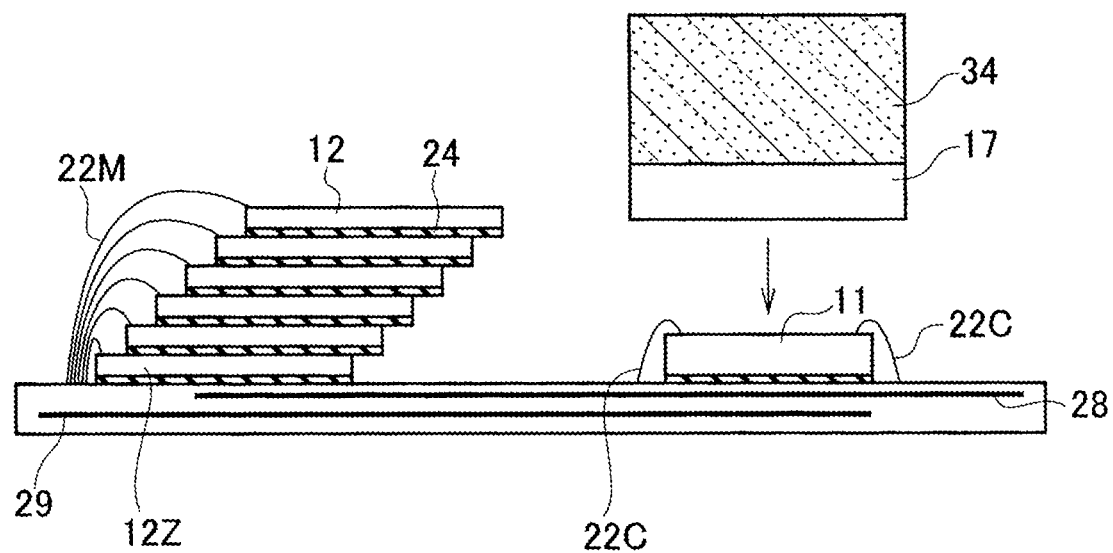
FIG. 16B is a second sectional view of a semiconductor device according to a second embodiment.

FIG. 16B is a second sectional view of the semiconductor device 1 according to the second embodiment.

(B1) Next, as illustrated in FIG. 16B, an insulating film 17 is formed in advance on a first heat conductive plate 34.

(B2) Next, as illustrated in FIG. 16B, a stacked structure of the insulating film 17 and the first heat conductive plate 34 is disposed on the upper surface of the controller 11. The first heat conductive plate 34 is bonded to the upper surface of the controller 11 with the insulating film 17. The first heat conductive plate 34 may be disposed on the upper surface of the controller 11 via the insulating film 17 by being flipped.

Figure 16C:
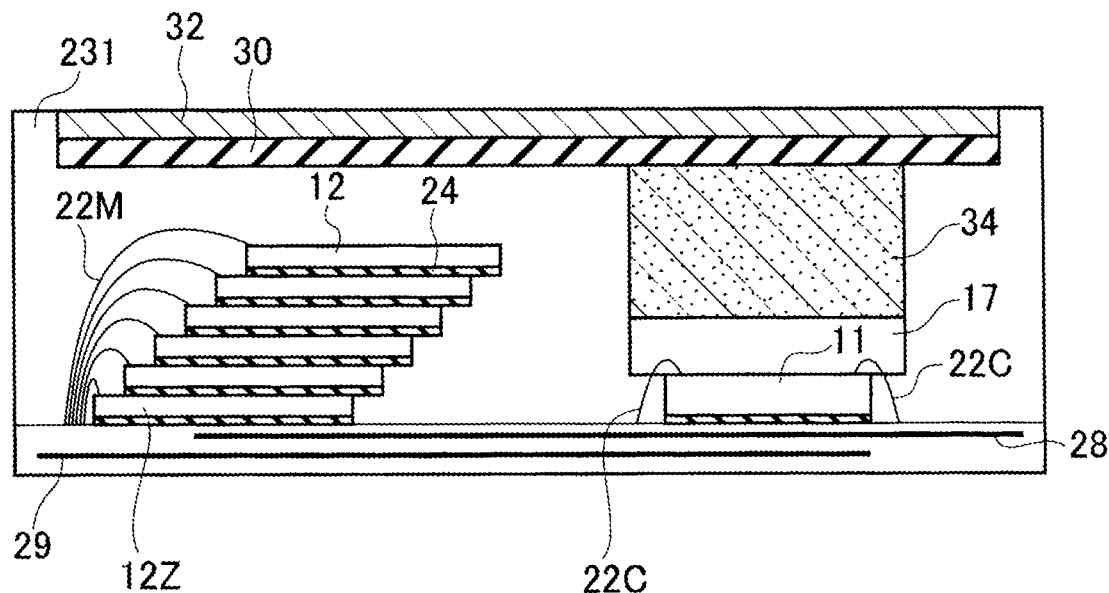
FIG. 16C is a third sectional view of a semiconductor device according to a second embodiment.

FIG. 16C is a third sectional view of the semiconductor device 1.

(C1) Next, as illustrated in FIG. 16C, the first heat conductive plate 34 is disposed on the upper surface of the controller 11 via the insulating film 17. A part of the bonding wire 22C on the upper surface of the controller 11 is incorporated in the insulating film 17 by the FOW technique.

(C2) Next, as illustrated in FIG. 16C, an insulating sheet 30 is integrally formed on a back or lower surface of the graphite sheet 32.

(C3) Next, as illustrated in FIG. 16C, the graphite sheet 32 is formed on the first heat conductive plate 34 via the insulating sheet 30.

(C4) Next, as illustrated in FIG. 16C, a sealing portion 231 for sealing the semiconductor memories 12 and 12Z, the controller 11, the bonding wires 22M and 22C, the insulating film 17, the first heat conductive plate 34, the insulating sheet 30, and the graphite sheet 32 is formed. An upper surface of the graphite sheet 32 is exposed from the sealing portion 231.

Figure 16D:
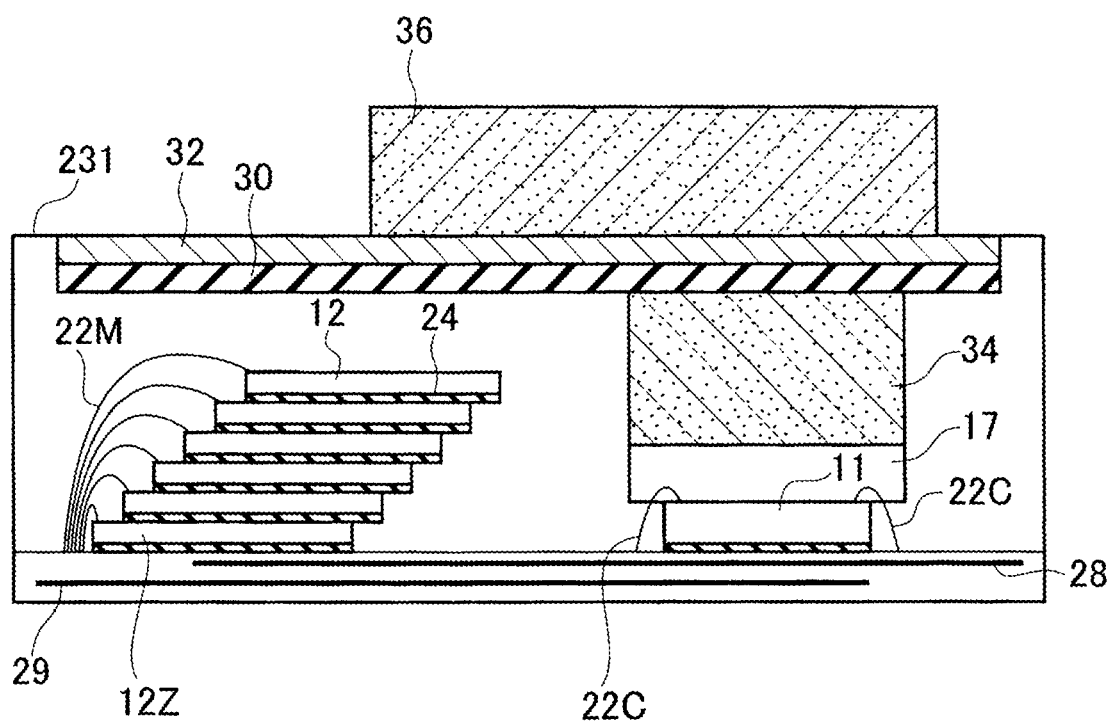
FIG. 16D is a fourth sectional view of a semiconductor device according to a second embodiment.

FIG. 16D is a fourth sectional view of the semiconductor device 1.

(D) Next, as illustrated in FIG. 16D, a second heat conductive plate 36 is disposed on a surface of the graphite sheet 32 facing the insulating sheet 30.

(E1) Next, as illustrated in FIG. 13, a second sealing portion 232 for sealing the sealing portion 231, the graphite sheet 32, and the second heat conductive plate 36 is formed. An upper surface of the second heat conductive plate 36 is exposed from the second sealing portion 232.

(E2) Next, as illustrated in FIG. 13, a plurality of solder balls 25 are formed on the second surface 21b. Modification Example 2

Figure 17:
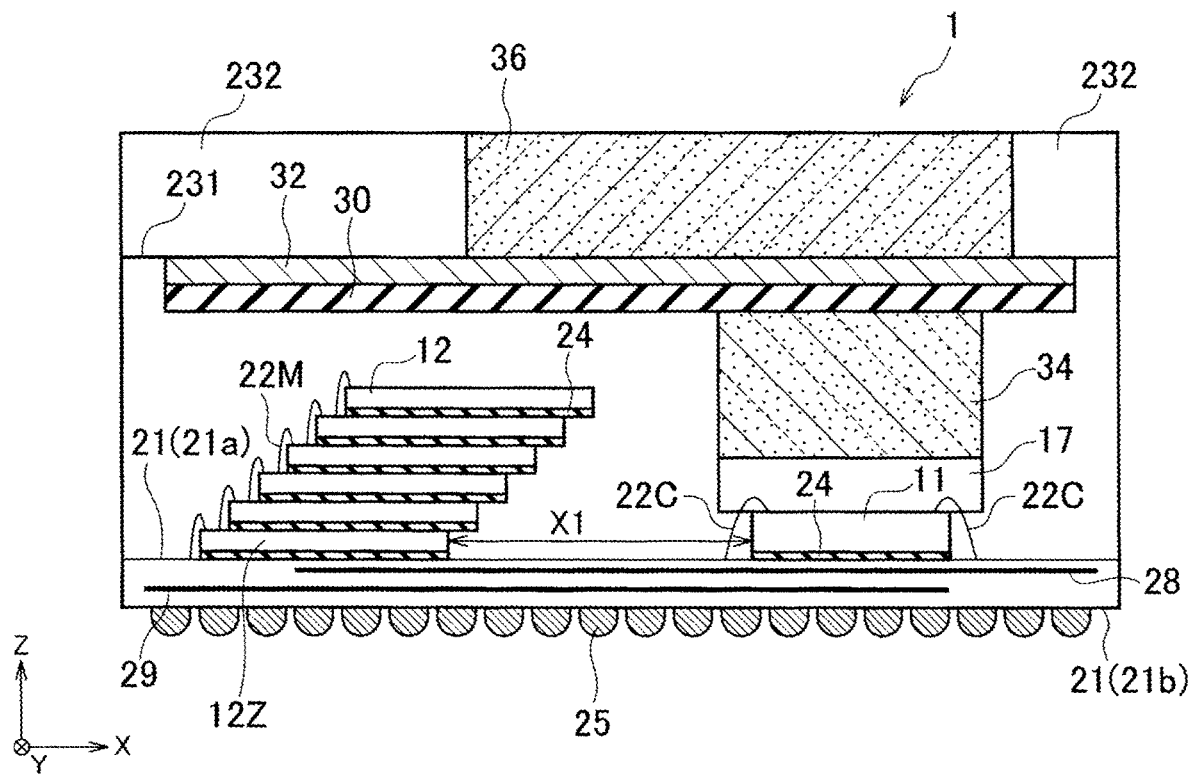
FIG. 17 is a sectional view of a semiconductor device according to a modification example.

FIG. 17 is a sectional view of the semiconductor device according to a modification example. The semiconductor device according to the modification example has a different connection structure of the bonding wire 22M connected to the semiconductor memory 12. Other configurations are the same as the configurations of the semiconductor device according to the second embodiment. In FIG. 17, the oscillator 14, the EEPROM 15, the RAM 13, and the temperature sensor 16 provided in the semiconductor device 1 are not shown.

In the semiconductor device according to the modification example, the bonding wires 22M connect the plurality of semiconductor memories 12. Further, the bonding wire 22M electrically connects the lowest-layer semiconductor memory 12Z and the board 21.

The semiconductor device 1 includes the board 21, the controller 11, the semiconductor memory 12, the bonding wires 22M and 22C, the first heat conductive plate 34, the second heat conductive plate 36, the insulating film 17, the graphite sheet 32, the insulating sheet 30, the sealing portions 231 and 232, the mount film 24, and the solder ball 25.

The semiconductor device 1 includes the graphite sheet therein, and the second heat conductive plate 36 is disposed on the graphite sheet 32. Thus, the heat of the semiconductor memory 12 and the controller 11 can be released to the second heat conductive plate 36 via the graphite sheet 32. Further, the semiconductor device 1 has a structure in which the graphite sheet 32 is interposed between the first heat conductive plate 34 and the second heat conductive plate 36. Thus, it is possible to improve heat dissipation speeds of the semiconductor memory 12 and the controller 11. Further, the semiconductor device can efficiently release the heat of the controller to the outside of the package, and it is possible to reduce an increase in the temperature of the semiconductor memory. Further, the semiconductor device includes the graphite sheet therein, and thus it is possible to shield the inside of the semiconductor device 1. Further, the semiconductor device includes the graphite sheet therein, and thus it is possible to improve heat dissipation.

Third Embodiment

Figure 18:
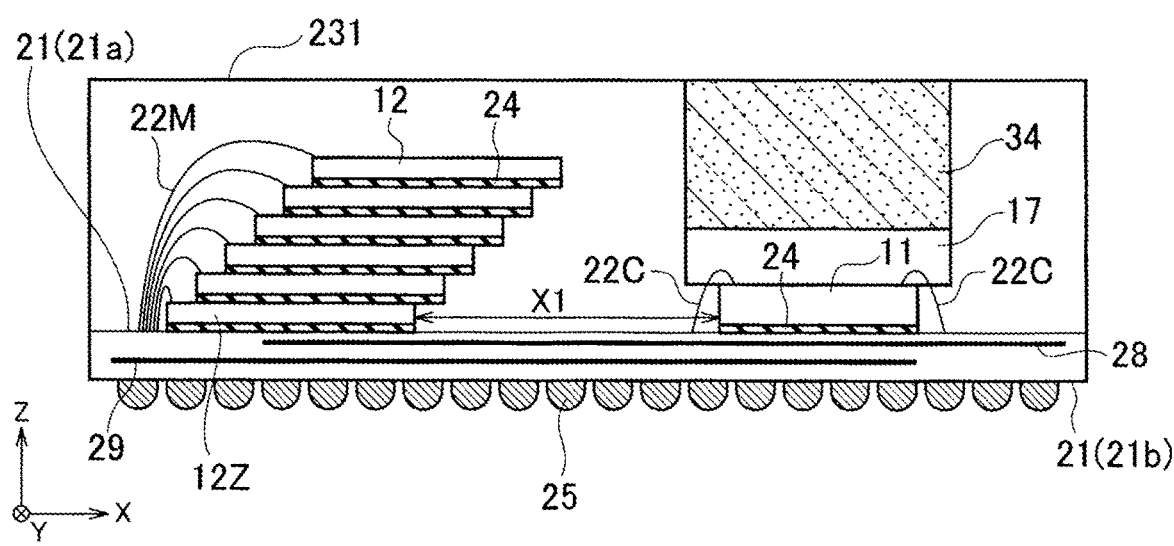
FIG. 18 is a sectional view of a semiconductor device according to a third embodiment.
Figure 19:
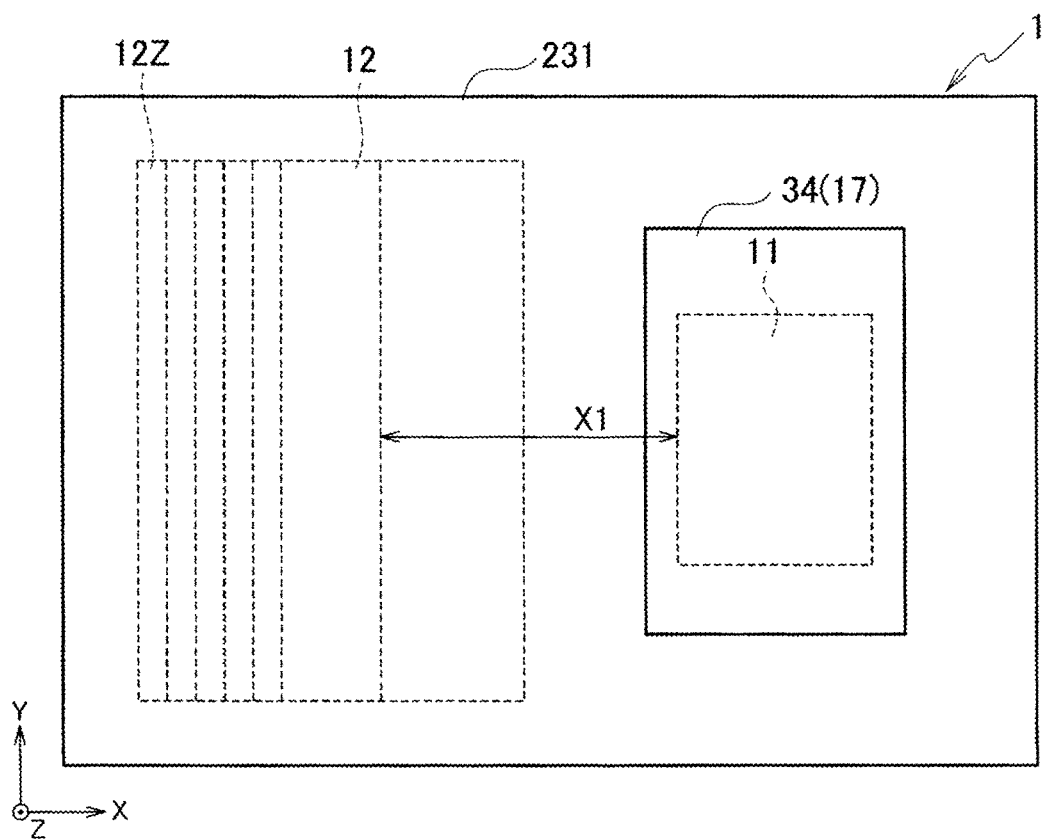
FIG. 19 is a top view of a semiconductor device according to a third embodiment.

FIG. 18 is a sectional view of the semiconductor device 1 according to a third embodiment. FIG. 19 is a top view of the semiconductor device 1 according to the third embodiment.

The semiconductor device 1 can release the heat of the first heat conductive plate 34 to the outside of the semiconductor device 1. In the semiconductor device 1, the first heat conductive plate 34 is disposed on the upper portion of the controller 11 via the insulating film 17. An upper surface of the first heat conductive plate 34 is exposed from the sealing portion 231.

Because of the structure of the semiconductor device 1 of the third embodiment, it is possible to prevent the heat from being confined inside the semiconductor device 1. The first heat conductive plate 34 is disposed on the controller 11 so as to absorb the heat. The upper surface of the first heat conductive plate 34 is exposed from the sealing portion 231. That is, a path for releasing the heat of the controller 11 to the outside of the semiconductor device 1 is formed.

Fourth Embodiment

Figure 20:
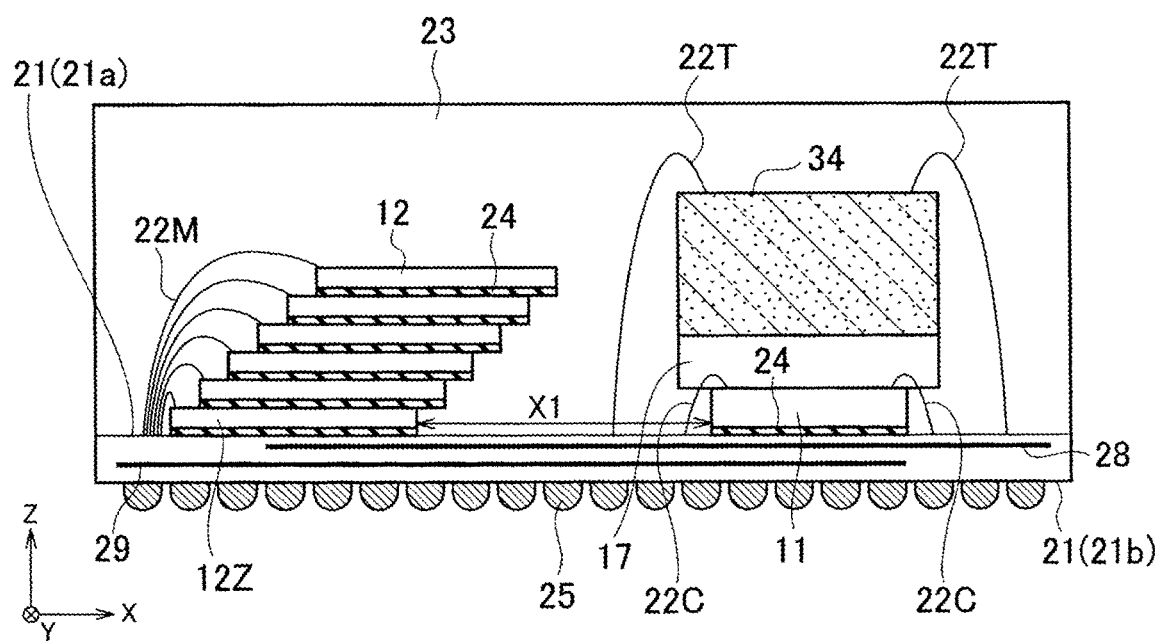
FIG. 20 is a sectional view of a semiconductor device according to a fourth embodiment.

FIG. 20 is a sectional view of the semiconductor device according to a fourth embodiment.

In the semiconductor device according to the fourth embodiment, the first heat conductive plate 34 is disposed on the upper portion of the controller 11 via the insulating film 17. Further, bonding wires 22T are connected between the upper surface of the first heat conductive plate 34 and the board 21. The first heat conductive plate 34 is stacked on the controller 11.

The bonding wires 22T are heat conductive wires. The bonding wires 22T are, for example, copper wires, silver wires, or gold wires. The diameters of the bonding wires 22T are, for example, approximately 20 µm to 50 µm. The heat generated from the controller 11 can be released to the board 21 and the solder ball 25 by the bonding wires 22T. The number of the bonding wires 22T may be increased in order to improve the heat conductivity.

The semiconductor device according to the fourth embodiment can efficiently release the heat of the controller to the outside of the package, and can reduce an increase in the temperature of the semiconductor memory.

Comparative Example

In an SSD, a system-on-a-chip (SoC) and a NAND flash memory are provided in one package. For this reason, the NAND flash memory is likely to be affected by heat generated from the SoC. As a technique of thermally insulating the NAND flash memory and the SoC, a package on package (PoP) technique and a thermal via (TMV) technique are known. The PoP is a technique for stacking and mounting ICs and components on an IC package. TMV is a technique for improving heat dissipation effect of components which are mounted on a front surface of a board. Structurally, TMV is a method of providing a through hole in a board and increasing an area and a volume used for heat dissipation by connecting copper foils on a front surface and a rear surface of the board to one another, that is, decreasing a thermal resistance to conduction between these copper foils.

The above-described embodiments are examples, and the scope of the present disclosure is not limited thereto. For example, in each of the embodiments, the controller and the board are bonded by bonding wires. In other examples, instead of the bonding wires, a flip chip technique may be used for bonding. In the flip chip technique, bumps provided on a front surface of a chip and a base board are directly bonded to each other without using wires. By this flip chip bonding, a thickness of the controller can be reduced, and thus the heat conductive plate can be thickened by amount up to the reduced thickness of the controller. Therefore, it is possible to further improve heat dissipation.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a substrate that has a first surface and a second surface on which a plurality of solder balls are provided;
   a semiconductor memory on the first surface of the substrate;
   a controller on the first surface of the substrate, separated from the semiconductor memory along a first direction, and configured to control the semiconductor memory;
   a graphite sheet extending along the first direction above the controller and the semiconductor memory;
   a first heat conductive plate between the controller and the graphite sheet;
   an insulating sheet between the graphite sheet and the first heat conductive plate;
   a first bonding wire connected to the controller;
   an insulating film between the controller and the first heat conductive plate; and
   a first sealing material that seals the semiconductor memory, the controller, and the graphite sheet, wherein
   at least a part of the first bonding wire is between the controller and the first heat conductive plate.

2. The semiconductor device according to claim 1, further comprising:
   a second heat conductive plate on an upper surface of the graphite sheet; and
   a second sealing material that seals the graphite sheet and the second heat conductive plate.

3. The semiconductor device according to claim 2, wherein a surface area of the graphite sheet is substantially the same as a surface area of the insulating sheet.

4. The semiconductor device according to claim 2, wherein a surface of the second heat conductive plate that contacts the graphite sheet has an area larger than an area of a surface of the first heat conductive plate that contacts the insulating sheet.

5. The semiconductor device according to claim 4, wherein a surface of the graphite sheet has an area larger than the area of the surface of the second heat conductive plate that contacts the graphite sheet.

6. The semiconductor device according to claim 1, wherein a surface area of the graphite sheet is smaller than an area of a surface of the first sealing material that extends along the surface of the graphite sheet.

7. The semiconductor device according to claim 1, wherein the graphite sheet has a surface area that is smaller than an area of the first surface of the substrate.

8. The semiconductor device according to claim 1, wherein the graphite sheet has a higher heat conductivity in a direction parallel to the substrate than a direction perpendicular to the substrate.

9. The semiconductor device according to claim 1, wherein the graphite sheet has a same heat conductivity in a direction parallel to the substrate and in a direction perpendicular to the substrate.

10. The semiconductor device according to claim 1, wherein the semiconductor memory includes a plurality of memories that are stacked such that an upper memory is shifted from a lower memory by a particular distance along the first direction.

11. The semiconductor device according to claim 1, further comprising:
a temperature sensor arranged on the first surface of the substrate closer to the controller than the semiconductor memory.

12. A semiconductor device, comprising:
a substrate that has a first surface and a second surface on which a plurality of solder balls are provided;
a semiconductor memory on the first surface of the substrate;
a controller on the first surface of the substrate, separated from the semiconductor memory along a first direction, and configured to control the semiconductor memory;
a first heat conductive plate above the controller;
a sealing material that seals the semiconductor memory, the controller, and the first heat conductive plate;
a first bonding wire connected to the controller; and
an insulating film between the controller and the first heat conductive plate, wherein
at least a part of the first bonding wire is between the controller and the first heat conductive plate.

13. The semiconductor device according to claim 12, wherein an upper surface of the first heat conductive plate is exposed through the sealing material.

14. The semiconductor device according to claim 12, further comprising:
a second bonding wire connected to an upper surface of the first heat conductive plate, wherein
the sealing portion further seals the second bonding wire.

15. The semiconductor device according to claim 12, further comprising:
a heat conductive member above an upper surface of the first heat conductive plate.

16. The semiconductor device according to claim 15, further comprising:
an insulating sheet between the first heat conductive plate and the heat conductive member.

17. The semiconductor device according to claim 12, wherein the semiconductor memory includes a plurality of memories that are stacked such that an upper memory is shifted from a lower memory by a particular distance along the first direction.

18. A semiconductor device, comprising:
a substrate that has a first surface and a second surface on which a plurality of solder balls are provided;
a semiconductor memory on the first surface of the substrate;
a controller on the first surface of the substrate, separated from the semiconductor memory along a first direction, and configured to control the semiconductor memory;
a graphite sheet extending along the first direction above the controller and the semiconductor memory; and
a first sealing material that seals the semiconductor memory, the controller, and the graphite sheet, wherein
a surface area of the graphite sheet is smaller than an area of a surface of the first sealing material that extends along the surface of the graphite sheet.

19. The semiconductor device according to claim 18, further comprising:
a first heat conductive plate between the controller and the graphite sheet.

20. The semiconductor device according to claim 18, further comprising:
a second heat conductive plate on an upper surface of the graphite sheet; and
a second sealing material that seals the graphite sheet and the second heat conductive plate.

* * * * *